United States Patent [19]

Lee

[11] Patent Number: 5,609,994
[45] Date of Patent: Mar. 11, 1997

[54] METHOD FOR PATTERNING PHOTORESIST FILM HAVING A STEPWISE THERMAL TREATMENT

[75] Inventor: Jun Seok Lee, Seoul, Rep. of Korea

[73] Assignee: Goldstar Electron Co., Ltd., Rep. of Korea

[21] Appl. No.: 360,418

[22] Filed: Dec. 21, 1994

[30] Foreign Application Priority Data

Nov. 11, 1994 [KR] Rep. of Korea .................. 29650/1994

[51] Int. Cl.[6] ....................................... G03F 7/36
[52] U.S. Cl. ..................... 430/323; 430/166; 430/192; 430/313; 430/330; 437/228; 216/38; 216/51
[58] Field of Search .................... 430/323, 192, 430/166, 165, 322, 314, 313, 330; 156/643, 646, 656, 659.1, 667, 668; 437/228

[56] References Cited

U.S. PATENT DOCUMENTS

| | | | |
|---|---|---|---|
| 4,599,137 | 7/1986 | Akiya | 430/313 |
| 4,634,645 | 1/1987 | Matsuda et al. | 430/314 |
| 5,032,491 | 7/1991 | Okumura et al. | 430/314 |
| 5,348,842 | 9/1994 | Khanna et al. | 430/330 |
| 5,366,851 | 11/1994 | Novembre | 430/330 |
| 5,470,693 | 11/1995 | Sachdev et al. | 430/330 |

*Primary Examiner*—John S. Chu

[57] ABSTRACT

A method for patterning a photoresist film, capable of preventing a notching phenomenon occurring upon forming a pattern of the photoresist film having a single layer structure and thereby accurately forming a pattern of a metal wiring or a gate with a desired dimension even on a layer exhibiting a severe topology by removing a portion of the photoresist film coated over the layer having a severe topology up to a depth corresponding to 30% or below of the thickness of the photoresist film to form a recess, forming an planarized inorganic material layer on the recess, and selectively removing a predetermined portion of the photoresist film under a condition that the inorganic material layer is used as a mask.

16 Claims, 3 Drawing Sheets

5,609,994

METHOD FOR PATTERNING PHOTORESIST FILM HAVING A STEPWISE THERMAL TREATMENT

BACKGROUND OF THE INVENTION

1. Field of the Invention

The present invention relates to a method for forming a pattern of a photoresist film and more particularly to a method for patterning a photoresist film capable of minimizing a scattering effect of a reflective light generated upon an exposure and thereby achieving an accurate patterning of the photoresist film having a single layer structure by forming an inorganic material layer over the photoresist film, patterning the inorganic material layer and then patterning the photoresist film by use of the patterned inorganic material layer as a mask.

2. Description of the Prior Art

In fabrication of a semiconductor device, a plurality of process steps to be applied to a substrate are generally necessary. As a result, the uppermost layer on the substrate may have a severe topology at its upper surface.

Where a photoresist film is coated over a layer having a topology in fabrication of a semiconductor device with a relatively large dimension, the topology does not cause any significant affect on the fabrication of the semiconductor device. However, such a topology may cause a significant effect in fabrication of a semiconductor device with a relatively small dimension.

For example, in formation of a desired pattern on the uppermost layer on a substrate utilizing a photoresist film having a single layer structure, a notching phenomenon may occur at the photoresist film due to a scattering of light caused by a topology of a layer over which the photo resist film is coated. In order to prevent such a notching phenomenon, there have been proposed various methods for planarizing the layer over which the photoresist film is coated.

In fabrication of a semiconductor device with a high integration degree inevitably involving a topology of not less than 1 µm, however, use of a photoresist film having a single layer structure still encounters the notching phenomenon caused by the severe topology of the uppermost layer even when existing planarization methods are used. As a result, it is difficult to achieve an accurate control for a critical dimension of a photoresist pattern to be formed. This results in a severe degradation in reliability and operational characteristic of the semiconductor device finally fabricated.

In order to solve the above-mentioned problem, there has been proposed a new method of controlling the critical dimension by use of a multi-layer resist process utilizing a photoresist film having a multi-layer structure including two or three layers. However, this method is complex and expensive. As a result, it is difficult to use the method for mass-production of semiconductor devices.

For this reason, various methods have also been proposed which still use a photoresist film having a single layer structure, but overcome the problem caused by the topology of the layer over which the photoresist film is coated. Most of these methods involve removing a selected surface portion of the photoresist film physically and chemically, and subsequently removing the remaining portion of the photoresist film by use of a reactive ion etch (RIE) process. As such methods, there have been known a silylation method, a contact enhancement material (CEM) technique, an antireflective coating (ARC) process, and an alkaline treatment.

An example of such conventional methods will now be described in detail in conjunction with FIGS. 1A to 1D.

In accordance with the illustrated method, first, a general process step for fabricating a semiconductor device is carried out, thereby sequentially forming a plurality of patterns on a substrate 1, as shown in FIG. 1A. Because of such a formation of patterns, the uppermost layer, denoted by the reference numeral 2, on the substrate 1 has a severe topology. Thereafter, a positive photoresist film 3 having a single layer structure is coated over the entire upper surface of the uppermost layer 2 so as to achieve a patterning of the uppermost layer 2.

For the patterning of the uppermost layer 2, an exposure step is carried out. That is, the photoresist film 3 is selectively exposed to light emitted from a light source (not shown) under a condition that a mask 4 is disposed between the light source and the photoresist film 3, as shown in FIG. 1B.

This exposure step will be described in more detail. The mask 4 is used to expose only a selected portion of the photoresist film 3 to light. That is, the exposure light projected onto an opaque chromium layer 5 of the mask 4 is shielded by the opaque chromium layer 5 so that a portion of the photoresist film 3 disposed beneath the chromium layer 5 is not exposed to the light. On the other hand, the exposure light projected onto a transparent quartz substrate of the mask 4 transmits through the transparent quartz substrate so that only a portion of the photoresist film 3 not disposed beneath the chromium layer 5 is exposed to the light.

In practice no light is projected onto the photoresist pattern portion disposed beneath the chromium layer 5 of the mask 4 because the chromium layer 5 shields the light. However, this photoresist pattern portion disposed beneath the chromium layer 5 is exposed to reflected light resulting from a reflection of the light transmitting through the transparent quartz substrate portion of the mask 4 not disposed beneath the chromium layer 5. That is, the light transmitting through the exposed transparent quartz substrate portion of the mask 4 is projected onto the photoresist film 3 and the uppermost layer 2 both disposed beneath the exposed transparent quartz substrate portion and then reflected by the surface of the uppermost layer 2. This reflected light is projected onto a part of the photoresist film portion disposed beneath the chromium layer 5. As a result, a latent image is formed on the photoresist film portion disposed beneath the chromium layer 5.

After completing the exposure step shown in FIG. 1B, a development is carried out, as shown in FIG. 1C. By the development, the portion of photoresist film 3 not disposed beneath the chromium layer 5 of the mask 4 is removed, thereby forming a pattern of the photoresist film 3. At this time, a part of the photoresist film portion disposed beneath the chromium layer 5 intended not to be removed, but formed with the latent image is also removed.

As a result, the pattern of photoresist film 3 has at its lower portion a width W1 smaller than a width W2 at its upper portion, as shown in FIG. 1C. In other words, the width W1 of the lower portion of the photoresist pattern is smaller than an intended width corresponding to the width of the chromium layer 5, that is, the width W2.

As shown in FIG. 1D, the photoresist pattern corresponding to the remaining portion of photoresist film 3 is then set. Using the set photoresist pattern as a mask, an exposed portion of the uppermost layer 2 is etched, thereby forming a pattern of the layer 2. The pattern of layer 2 has a width smaller than an intended width.

Thereafter, the photoresist pattern is removed to expose the pattern of layer 2.

As apparent from the above description, in accordance with the conventional method, the profile of the photoresist film is degraded because a severe light scattering phenomenon occurs at the layer having a severe topology upon the exposure. This results in a degradation in uniformity of the critical dimension control, thereby preventing a pattern with a desired dimension from being obtained. As a result, it is impossible to obtain a pattern with a critical dimension for fabrication of a highly integrated semiconductor device. This results in a degradation in resolution.

SUMMARY OF THE INVENTION

Therefore, an object of the invention is to provide a method for patterning a photoresist film, capable of preventing a notching phenomenon occurring upon forming a pattern of the photoresist film having a single layer structure and thereby accurately forming a photoresist pattern with a desired dimension even on a layer exhibiting a severe topology.

In accordance with the present invention, this object can be accomplished by providing a method for patterning a photoresist film, comprising the steps of: forming a layer to be patterned over a substrate; coating a photoresist film over the layer; selectively forming a recess at a predetermined region of the photoresist film; forming a planarized inorganic material layer on the recess of the photoresist film; and removing a predetermined portion of the photoresist film under a condition that the inorganic material layer is used as a mask.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Referring to FIGS. 2A to 2E, a method for patterning a photoresist film in accordance with an embodiment of the present invention will be described in detail.

Figure 1A:
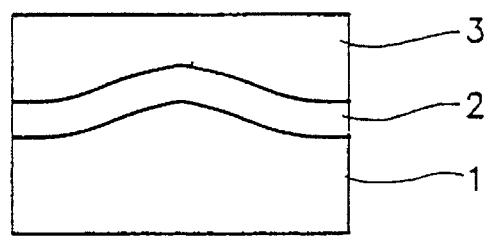
FIGS. 1A to 1D are sectional views respectively illustrating a method for patterning a photoresist film in accordance with the prior art.
Figure 1B:
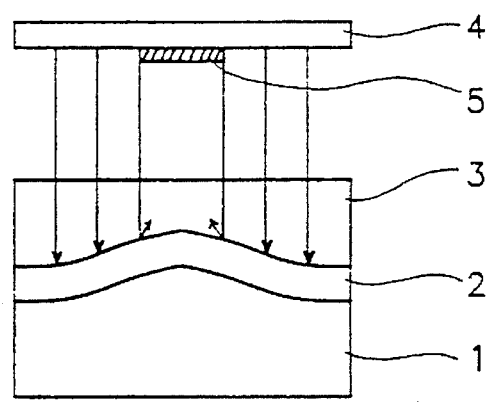
Figure 1C:
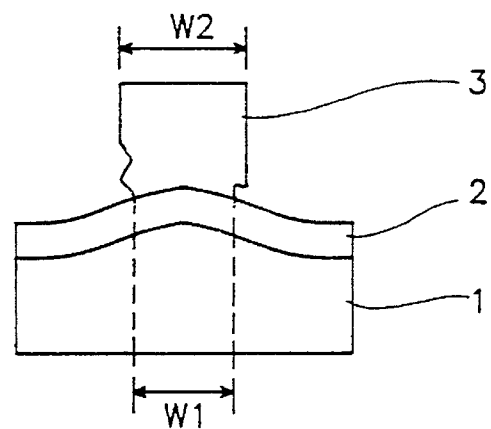
Figure 1D:
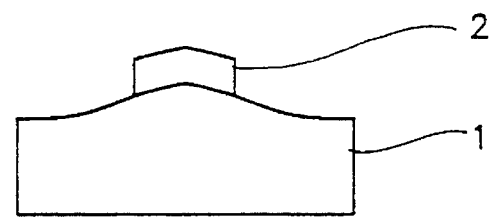
Figure 2A:
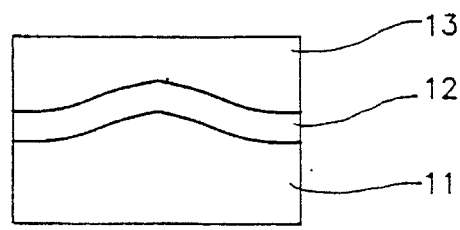
FIGS. 2A to 2E are sectional views respectively illustrating a method for patterning a photoresist film in accordance with an embodiment of the present invention.

As shown in FIG. 2A, first, a general process step for fabricating a semiconductor device is carried out, thereby sequentially forming a plurality of layer patterns on a substrate 11 such as a single crystalline silicon substrate. Because of such a formation of patterns, the uppermost layer, denoted by the reference numeral 12, on the substrate 11 has a severe topology.

Thereafter, a positive photoresist film 13 having a single layer structure is coated to a thickness of 1.5 μm over the entire upper surface of the uppermost layer 12 so as to achieve a patterning of the uppermost layer 12. The photoresist film 13 comprises a photoresist film essentially consisting of a novolac resin and a naphthoquinone-diazide-sulfonate-ester compound.

Figure 2B:
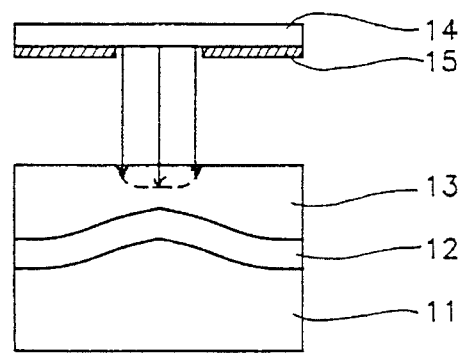

The photoresist film 13 is then subjected to an under-exposure using a mask 14 formed with a chromium layer 15 having a predetermined pattern, as shown in FIG. 2B. The exposure is achieved using a light with an energy of 80 to 300 mJ/cm$^2$ emitted from a light source, namely, a stepper which may be commercially available from Cannon Co., Ltd. (Model No. 2000il). This will be described in more detail.

The exposure light projected onto the opaque chromium layer 15 of the mask 14 is shielded by the opaque chromium layer 15, so that a portion of the photoresist film 13 disposed beneath the chromium layer 15 is not exposed to the light. On the other hand, the exposure light projected onto a portion of a transparent quartz substrate of the mask 14 not covered with the chromium layer 15 transmits through the transparent quartz substrate, so that a portion of the photoresist film 13 not disposed beneath the chromium layer 15 is exposed to the light. At this time, the exposure light irradiates the exposed portion of photoresist film 13 up to a depth corresponding to 30% or less of the entire thickness of the photoresist film 13.

Since the exposure light transmitting through the transparent quartz substrate of mask 14 irradiates only 30% or less of the thickness of the photoresist film 13 disposed beneath the transparent quartz substrate, it does not reach the upper surface of the uppermost layer 12 exhibiting a severe topology. As a result, there is no light reflected by the upper surface of the uppermost layer. This means that no latent image is formed at the portion of photoresist film 13 disposed beneath the chromium layer 15 of mask 14.

Figure 2C:
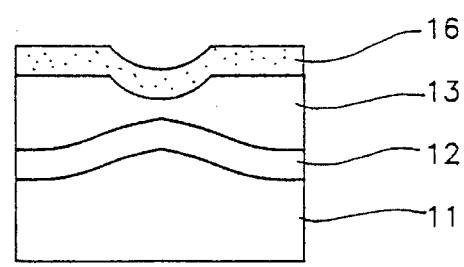

Subsequently, the photoresist film 13 is subjected to an optimum development or an under-development for 5 or 50 seconds so as to remove the portion of photoresist film 13 subjected to the under-exposure, as shown in FIG. 2C.

As the photoresist film 13 is partially removed, a recess is formed in the photoresist film 13. The recess has a width corresponding to that of the portion of mask 14 not covered with the chromium layer 15.

Thereafter, the recessed photoresist film 13 is subjected to a baking several times at different temperatures ranging from 110° C. to 300° C. for 2 minutes each time. Preferably, the baking is carried out three times respectively at a temperature ranging from 130° C. to 160° C., a temperature of 190° C. and a temperature of 230° C., respectively.

Over the exposed entire upper surface of the photoresist film 13, an inorganic material layer 16 comprised of, for example, an oxide film is then deposited to a thickness of 2,000Å at 190° C. using a plasma chemical deposition process.

Figure 2D:
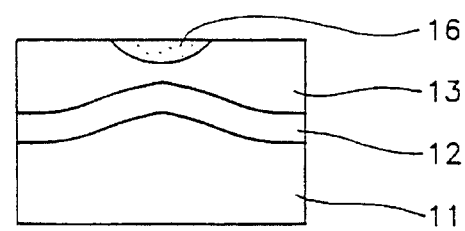

The inorganic material layer 16 is then etched back or subjected to a chemical mechanical polishing (CMP) until the upper surface of photoresist film 13 is exposed, as shown in FIG. 2D. As a result, the inorganic material layer 16 remains only in the recess of the photoresist film 13. At this time, the inorganic material layer 16 has a planarized surface.

Figure 2E:
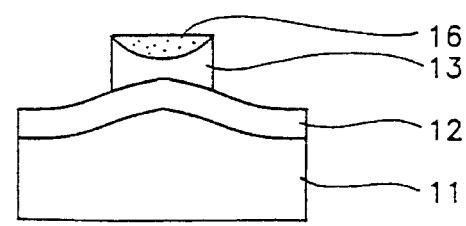

Under a condition that the inorganic material layer 16 is used as a mask, the photoresist film 13 is then etched using a physical process such as an oxygen ($O_2$) plasma process or an argon (Ar) sputtering process, as shown in FIG. 2E.

The etching is carried out under conditions of 35 $O_2$, 10 Ar, 30 Gauss, 450 Watts, 10 mTorrs, the end of point of 160" and the over-etch of 40".

Using both the inorganic material layer 16 and the photoresist film 13 as a mask, the uppermost layer 12 is selectively etched. Thus, a desired pattern is surely obtained.

Another method for fabricating a semiconductor device in accordance with another embodiment of the present invention will now be described in conjunction with FIGS. 3A to 3D. In FIG. 3A to 3D, elements respectively corresponding to those in FIGS. 2A to 2E are denoted by the same reference numerals.

Figure 3A:
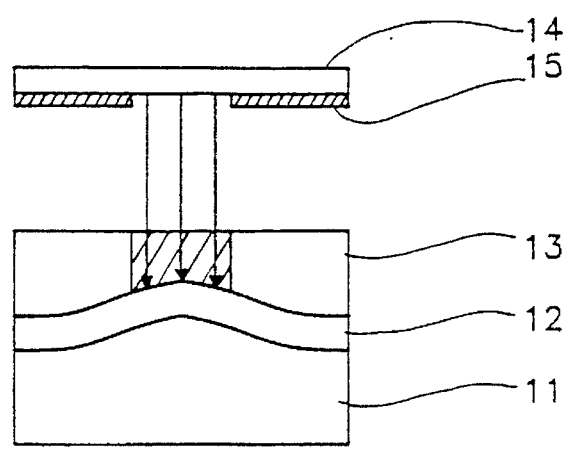
FIGS. 3A to 3D are sectional views respectively illustrating a method for patterning a photoresist film in accordance with another embodiment of the present invention.

In accordance with this method, first, the same process step as that of FIG. 2A is carried out, as shown in FIG. 3A. Thereafter, a photoresist film 13 formed at the above step is then subjected to an optimum exposure to a light emitted from a light source using a mask 14 formed with a chromium layer 15 having a predetermined pattern.

This will be described in more detail. The exposure light projected onto the opaque chromium layer 15 of the mask 14 is shielded by the opaque chromium layer 15, so that a portion of the photoresist film 13 disposed beneath the chromium layer 15 is not exposed to the light. On the other hand, the exposure light projected onto a portion of a transparent quartz substrate of the mask 14 not covered with the chromium layer 15 transmits through the transparent quartz substrate, so that a portion of the photoresist film 13 not disposed beneath the chromium layer 15 is exposed to the light. At this time, the exposure light irradiates the entire thickness of the photoresist film 13 such that it reaches the upper surface of an uppermost layer 12 disposed beneath the photoresist film 13.

The light transmitting through the transparent quartz substrate of mask 14 and reaching an upper surface portion of the uppermost layer 12 not disposed beneath the chromium layer 15 is reflected by the upper surface portion exhibiting a severe topology. As a result, a latent image is formed at the portion of photoresist film 13 disposed beneath the chromium layer 15 of mask 14.

Figure 3B:
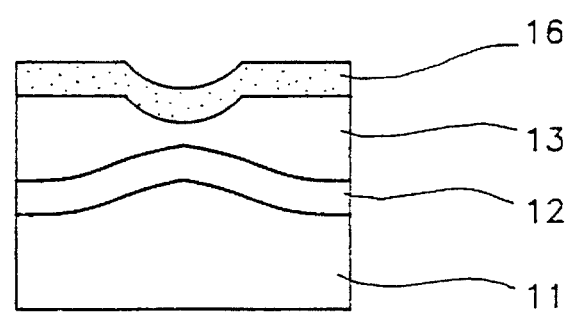

Subsequently, the photoresist film 13 is subjected to an under development for 5 or 50 seconds so as to remove a part of the portion of photoresist film 13 subjected to the exposure up to a depth corresponding to 30% or less of the thickness of the photoresist film 13, as shown in FIG. 3B. Accordingly, a portion of the photoresist film 13 not subjected to the development is not removed irrespective of the latent image possibly formed thereon.

As the photoresist film 13 is partially removed, a recess is formed in the photoresist film 13. The recess has a width corresponding to that of the portion of mask 14 not covered with the chromium layer 15.

Thereafter, the recessed photoresist film 13 is subjected to a baking in a temperature range from 110° C. to 300° C. Over the exposed entire upper surface of the photoresist film 13, an inorganic material layer 16 comprised of, for example, an oxide film is then deposited to a thickness of 2,000Å using the plasma chemical deposition process.

Figure 3C:
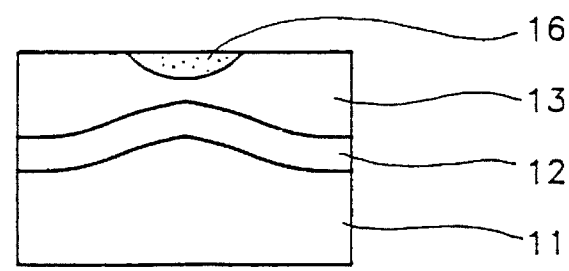

The inorganic material layer 16 is then etched back until the upper surface of photoresist film 13 is exposed, as shown in FIG. 3C. In this embodiment, the etch-back step can be more easily achieved, as compared to the embodiment of FIGS. 2A to 2E. By the etch-back, the inorganic material layer 16 remains only in the recess of the photoresist film 13. At this time, the inorganic material layer 16 has a planarized surface.

Figure 3D:
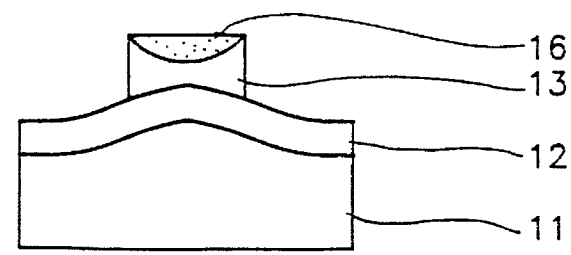

Under a condition that the inorganic material layer 16 is used as a mask, the photoresist film 13 is then etched using a physical process such as the O₂ plasma process or the Ar sputtering process, as shown in FIG. 3D.

Using both the inorganic material layer 16 and the photoresist film 13 as a mask, the uppermost layer 12 is selectively etched. Thus, a desired pattern is surely obtained.

As apparent from the above description, the present invention provides a method for patterning a photoresist film, capable of improving a resolution in spite of a severely non-uniform thickness of the photoresist film caused by a severe topology of a layer disposed beneath the photoresist film by patterning the photoresist film only up to a part of the entire depth of the photoresist film, and capable of preventing a notching phenomenon occurring upon forming a pattern of the photoresist film and thereby accurately forming a photoresist pattern with a desired dimension by forming an inorganic material layer on a recess formed upon partially patterning the photoresist film and dry etching the photoresist film using the inorganic material layer as a mask.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for patterning a photoresist film, comprising the steps of:

forming a layer to be patterned over a substrate;

coating a photoresist film over the layer;

selectively forming a recess at a predetermined region of the photoresist film;

performing a stepwise thermal treatment of the recessed photoresist film in a temperature ranging from 110° C. to 300° C.;

forming a planarized inorganic material layer on the recess of the photoresist film; and removing a predetermined portion of the photoresist film under a condition that the inorganic material layer is used as a mask.

2. A method for patterning a photoresist film, comprising the steps of:

forming a layer to be patterned over a substrate;

coating a photoresist film over the layer;

selectively forming a recess at a predetermined region of the photoresist film by exposing a selected portion of the photoresist film;

performing a stepwise thermal treatment of the recessed photoresist film in a temperature ranging from 110° C. to 300° C.;

forming a planarized inorganic material layer on the recess of the photoresist film; and removing a predetermined portion of the photoresist film under a condition that the inorganic material layer is used as a mask.

3. A method in accordance with claim 1, wherein the step of removing the predetermined photoresist film portion is carried out using a physical process.

4. A method in accordance with claim 3, wherein the step of removing the predetermined photoresist film portion is carried out using an oxygen plasma process.

5. A method in accordance with claim 3, wherein the step of removing the predetermined photoresist film portion is carried out using an argon sputtering process.

6. A method in accordance with claim 1, wherein the recess is formed by removing a portion of the photoresist film disposed at the predetermined region up to a depth corresponding to 30% or less of the thickness of the photoresist film by use of an exposure process and a development process.

7. A method in accordance with claim 6, wherein the recess is formed using an under exposure process and an optimum development process.

8. A method in accordance with claim 6, wherein the recess is formed using an under exposure process and an under development process.

9. A method in accordance with claim 6, wherein the recess is formed using an optimum exposure process and an under development process.

10. A method in accordance with claim 6, wherein the photoresist film is exposed to a light with an energy of 80 to 300 mJ/cm$^2$.

11. A method in accordance with claim 6, wherein the photoresist film is developed for 5 to 50 seconds.

12. A method in accordance with claim 1, wherein the step of forming the planarized inorganic material layer includes the steps of:

depositing an inorganic material layer over the photoresist film, and etching back a predetermined portion of the inorganic material layer.

13. A method in accordance with claim 1, wherein the recessed photoresist film is subjected to the thermal treatment several times respectively at a temperature ranging from 130° C. to 160° C., at a temperature of 200° C. and a temperature of 230° C., in a stepwise manner, for 2 minutes each time.

14. A method in accordance with claim 1, wherein the photoresist film includes a novolac resin and a naphthoquinone-diazide-sulfonate-ester compound.

15. A method in accordance with claim 1, wherein said inorganic material layer is an oxide film.

16. A method in accordance with claim 15, wherein said oxide film is deposited at 190° C. using a plasma chemical deposition process.

\* \* \* \* \*